US009457956B2

(12) United States Patent
Adachi et al.

(10) Patent No.: US 9,457,956 B2
(45) Date of Patent: Oct. 4, 2016

(54) DRAWER DEVICE AND STORAGE DEVICE

(75) Inventors: Naruto Adachi, Inuyama (JP); Yasuhisa Ito, Inuyama (JP)

(73) Assignee: MURATA MACHINERY, LTD., Kyoto (JP)

( * ) Notice: Subject to any disclaimer, the term of this patent is extended or adjusted under 35 U.S.C. 154(b) by 127 days.

(21) Appl. No.: 14/122,932

(22) PCT Filed: Mar. 9, 2012

(86) PCT No.: PCT/JP2012/056193
§ 371 (c)(1),
(2), (4) Date: Dec. 30, 2013

(87) PCT Pub. No.: WO2012/164994
PCT Pub. Date: Dec. 6, 2012

(65) Prior Publication Data
US 2014/0140794 A1    May 22, 2014

(30) Foreign Application Priority Data
May 31, 2011    (JP) ............................. P2011-121859

(51) Int. Cl.
*B65G 1/04*     (2006.01)
*H01L 21/677*   (2006.01)
*B66F 7/06*     (2006.01)

(52) U.S. Cl.
CPC ............... *B65G 1/04* (2013.01); *B65G 1/0435* (2013.01); *B66F 7/06* (2013.01); *H01L 21/67733* (2013.01); *H01L 21/67736* (2013.01); *H01L 21/67769* (2013.01); *B65G 2201/0297* (2013.01)

(58) Field of Classification Search
CPC ................. B65G 1/04; B65G 1/0435; B65G 2201/0297; B66F 7/06; H01L 21/67733; H01L 21/67769; H01L 21/67736
See application file for complete search history.

(56) References Cited

U.S. PATENT DOCUMENTS

| 2,513,440 A | 7/1950 | Alderson |
| 6,558,101 B2 * | 5/2003 | Inui ...................... B65G 1/0435 414/267 |

(Continued)

FOREIGN PATENT DOCUMENTS

| CN | 1444355 A | 9/2003 | |
| DE | 3607910 A1 * | 6/1987 | ............. B65G 49/00 |

(Continued)

OTHER PUBLICATIONS

English translation of international preliminary report on patentability dated Dec. 12, 2013 issued in corresponding PCT application PCT/JP2012/056193.

(Continued)

*Primary Examiner* — Kaitlin Joerger
(74) *Attorney, Agent, or Firm* — DLA Piper LLP (US)

(57) ABSTRACT

A drawer device and a storage device improving workability are provided. A drawer device 1 includes supporting members 2a, 2b configured to be inserted in a gap under a FOUP 120 loaded on a shelf 134 and to be fixed to the shelf 134, and lifting members configured to switch between a first height position and a second height position where the first height position enables insertion of the supporting members 2a, 2b into the gap and the second height position allows the lifting member to lift the FOUP 120 higher than the first height position, and configured to allow the FOUP 120 to slide toward the front of the shelf 134 at the second height position.

7 Claims, 15 Drawing Sheets

(56) References Cited

U.S. PATENT DOCUMENTS

| | | | |
|---|---|---|---|
| 6,923,612 B2* | 8/2005 | Hansl | B66F 9/07 414/277 |
| 7,771,152 B2* | 8/2010 | Waltersbacher | B65G 1/0414 414/279 |
| 8,105,005 B2* | 1/2012 | Yoshida | B65G 17/20 212/332 |
| 8,231,324 B2* | 7/2012 | Yoshida | B65G 1/0407 414/280 |
| 8,928,481 B2* | 1/2015 | Abe | 340/572.1 |
| 2004/0024489 A1 | 2/2004 | Fujiki et al. | |
| 2004/0191032 A1* | 9/2004 | Foulke | B65G 1/04 414/280 |
| 2006/0099055 A1* | 5/2006 | Stefani | B65G 1/0435 414/277 |
| 2009/0196720 A1* | 8/2009 | Kostmann et al. | 414/331.01 |

FOREIGN PATENT DOCUMENTS

| | | |
|---|---|---|
| JP | 2009-096610 | 5/2009 |
| JP | 2011-001149 | 1/2011 |
| KR | 20080077121 A | 8/2008 |

OTHER PUBLICATIONS

Japanese language international search report dated May 29, 2012 and its English language translation issued in corresponding PCT application PCT/JP2012/056193 cites the foreign patent documents listed above.

* cited by examiner

Fig.3
(a) 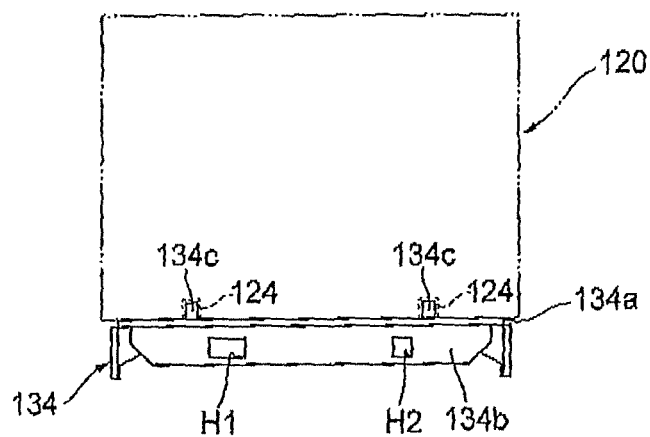
(b) 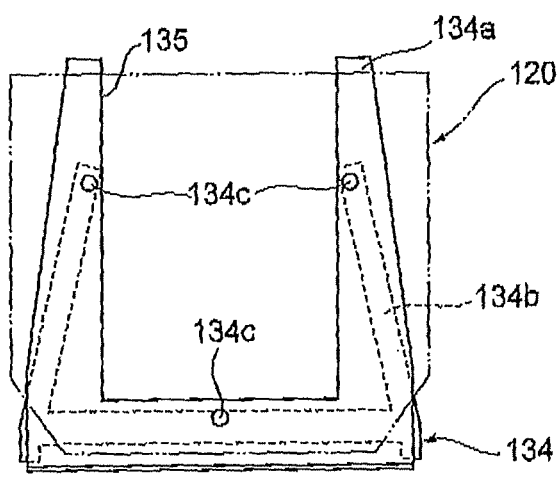
(c) 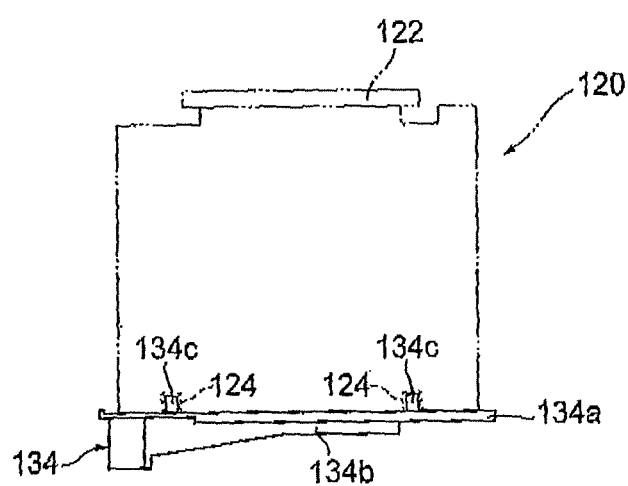

Fig.11
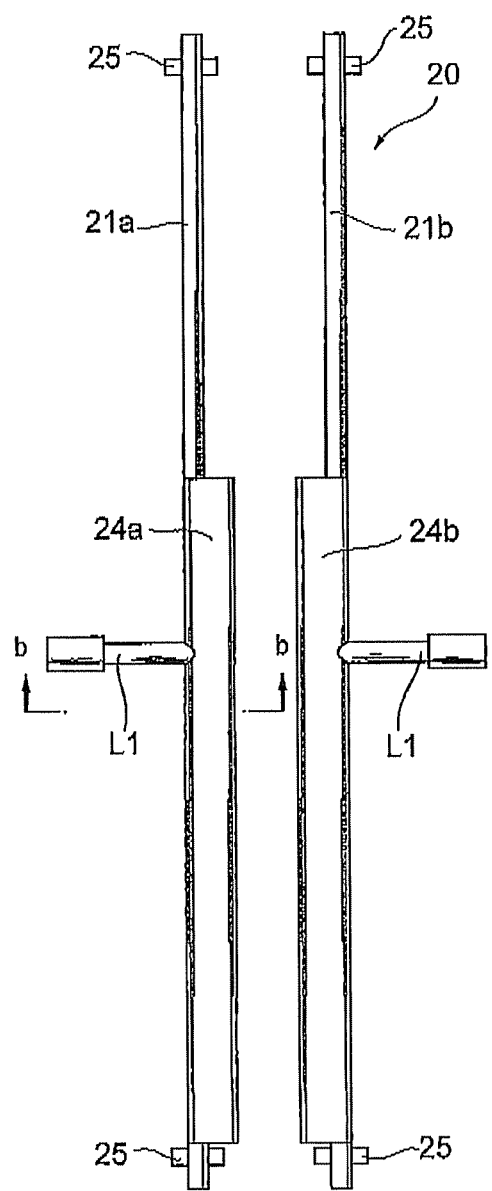
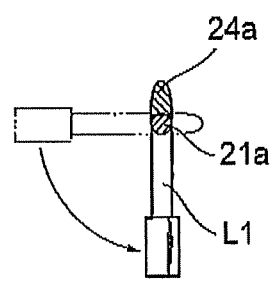

DRAWER DEVICE AND STORAGE DEVICE

This application is a national stage of international application No. PCT/JP2012/056193, filed on Mar. 9, 2012, and claims priority under 35 USC 119 of Japanese Patent Application No. 2011-121859, filed on May 31, 2011, which are incorporated herein by reference.

TECHNICAL FIELD

The present invention relates to a drawer device used to manually draw an article stored in a storage device and relates to a storage device provided with the drawer device.

BACKGROUND ART

In a storage device storing a front-opening unified pod (FOUP) containing a semiconductor wafer, a transfer unit transfers the FOUP between a port for loading/unloading and a shelf. In the storage device including the transfer unit, if the transfer unit does not work because of a trouble or other reasons, the FOUP is manually transferred. However, the FOUP becomes larger and heavier as semiconductor wafers becomes larger these days, thus, it is difficult to handle the FOUP manually.

For example, a storage device described in Patent Literature 1 includes a manual carrier unit that enables manual operation, besides a transfer unit. The manual carrier unit includes a holding member configured to hold a flange of a FOUP, a belt joined to the holding member, a hoisting mechanism configured to hoist the belt, and a sliding mechanism configured to slide on a ceiling in a storage device. With this configuration, the FOUP can be carried manually when the transfer unit is unavailable.

CITATION LIST

Patent Literature

Patent Literature 1: Japanese Patent Application Laid-Open Publication No. 2011-1149

SUMMARY OF INVENTION

Technical Problem

The above-described manual carrier unit of the storage device requires that the holding member be attached on the flange of the FOUP. However, working in the narrow gap between the FOUP and a shelf with the holding member inserted therein is not easy. Thus, improvement of the workability related to manual carriage of a FOUP is demanded.

The present invention is made to solve the aforementioned problem and aims to provide a drawer device and a storage device capable of improving workability.

Solution to Problem

In one aspect of the present invention, a drawer device is provided to a storage device including a plurality of shelves for loading and unloading an article through an opening that opens forward to draw the article forward from each shelf through the opening, and the drawer device includes: a supporting member configured to be inserted in a gap under the loaded article on any one of the shelves and to be fixed to the shelf, and a lifting member provided to the supporting member, configured to switch between a first height position and a second height position, where the first height position enables insertion of the supporting member into the gap and the second height position allows the lifting member to lift the article higher than the first height position, and configured to slide the article toward the front of the shelf at the second height position.

The drawer device includes the supporting member configured to be inserted in the gap under the article, and to be fixed to the shelf, and the lifting member configured to switch between the first height position and the second height position. Taking the first height position, the lifting member can be inserted in a narrow gap with the supporting member, and thus the supporting member can be easily fixed to the shelf. Furthermore, when the supporting member is fixed and the lifting member switches to the second height position, the article can be lifted up and can be slid and drawn to the front of the shelf. As described above, the drawer device can be installed easily in a narrow gap between the shelf and the article. This makes the work for fitting the holding member performed in the narrow gap unnecessary, for example. Thus the workability can be improved.

In the drawer device in the present invention, the respective shelves may be provided with an alignment pin configured to be inserted in an alignment hole in the bottom of the article when loading thereon the article, and the second height position is preferred to be a position at which the alignment pin comes out the alignment hole. The article is positioned with the alignment pin provided to the shelf, and thus the displacement in front to back and side to side is regulated. Configuring the second height position to be a position at which the alignment pin comes out the alignment hole to lift up the article from such a shelf enables secure drawing of the article from the shelf provided with the alignment pin.

In the drawer device in the present invention, the supporting member and the lifting member may be elongated components, and the supporting member and the lifting member may be connected through a linkage mechanism so that the lifting member is allowed to switch between the first height position and the second height position. With this configuration, the lifting member moves toward or away from the supporting member through the linkage mechanism and is switched between the first height position and the second height position. Thus, the operation can be easy and the reliability of the motion is secured.

In the drawer device in the present invention, the supporting member and the lifting member may be elongated components, and the lifting member may move along a guide member regulating the motion between the first height position and the second height position, and a cam member configured to switch the lifting member between the first height position and the second height position may be provided to at least one of the supporting member and the lifting member. With this configuration, the lifting member moves along the guide member. Thus, the switching between the first height position and the second height position can be performed accurately. Furthermore, the height positions of the lifting member are suitably switched by the cam member.

In the drawer device in the present invention, the supporting member may be an elongated component and configured to rotate about an axis thereof, the lifting member may have an approximately elliptic section and may be provided to the supporting member integrally, the first height position may provide a state in which the major axis of the section of the lifting member is almost horizontal, and the second height position may provide a state in which the major axis of the section of the lifting member is almost vertical. With this configuration, the lifting member can be easily switched between the first height position and the second height position by rotationally operating the supporting member. Furthermore, integrating the supporting member and the lifting member simplifies the structure and improves durability.

In another aspect of the present invention, a storage device includes: a case, a plurality of shelves provided in the case and each configured to load and unload an article through an opening that opens forward, a port performing loading and unloading the article, a transfer unit configured to transfer the article between the shelf and the port, and a drawer device for drawing the article forward from the shelf through the opening, in which the drawer device includes: a supporting member configured to be inserted in a gap under the loaded article on any one of the shelves and to be fixed to the shelf, and a lifting member provided to the supporting member, configured to switch between a first height position and a second height position, where the first height position enables insertion of the supporting member into the gap and the second height position allows the lifting member to lift the article higher than the first height position, and configured to slide the article toward the front of the shelf at the second height position.

The storage device includes the drawer device. The drawer device includes the supporting member configured to be inserted in the gap under the article and to be fixed to the shelf, and the lifting member configured to switch between the first height position and the second height position. Taking the first height position, the lifting member can be inserted in a narrow gap with the supporting member, and thus the supporting member can be easily fixed to the shelf. Furthermore, when the supporting member is fixed and the lifting member switches to the second height position, the article can be lifted up and can be slid and drawn to the front of the shelf. Thus, if the transfer unit does not work, the article can be drawn from the shelf easily. As described above, the drawer device can be installed easily in a narrow gap between the shelf and the article. This makes, for example, the work for fitting the holding member performed in the narrow gap unnecessary. Thus the workability can be improved.

The drawing unit can be inserted in the narrow gap under the article, therefore, an interval between the shelves can be set to a certain degree in which the article lifted up does not come into contact with the upper shelf. Thus, it is not necessary to secure a space conventionally used to insert the holding member, and the storage efficiency for the article in the storage device can be improved.

The storage device in the present invention may further include, a carrier unit configured to be manually operated and including: a holding member configured to hold the article, a hoisting mechanism configured to feed and wind a belt joined to the holding member, and a traveling mechanism provided with the hoisting mechanism and configured to travel along a rail installed on an upper portion of the case. As described above, providing the carrier unit configured to be manually operable allows the article drawn by the drawer device to be transferred easily to the outside of the case or the port. Thus, the workability can be further improved and the transfer time can be reduced.

Advantageous Effects of Invention

According to the present invention, the workability of unloading articles on a storage device can be improved.

BRIEF DESCRIPTION OF DRAWINGS

FIG. 3 is a diagram illustrating a mounting member and a fixing member.

FIG. 11 is a diagram illustrating a drawer device according to a second embodiment of the present invention.

DESCRIPTION OF EMBODIMENTS

The following describes a preferred embodiment of the present invention in detail with reference to the accompanying drawings. Note that, the same or corresponding components are denoted by the same reference signs in each drawing, and redundant descriptions are omitted.

Carrier System

Figure 1:
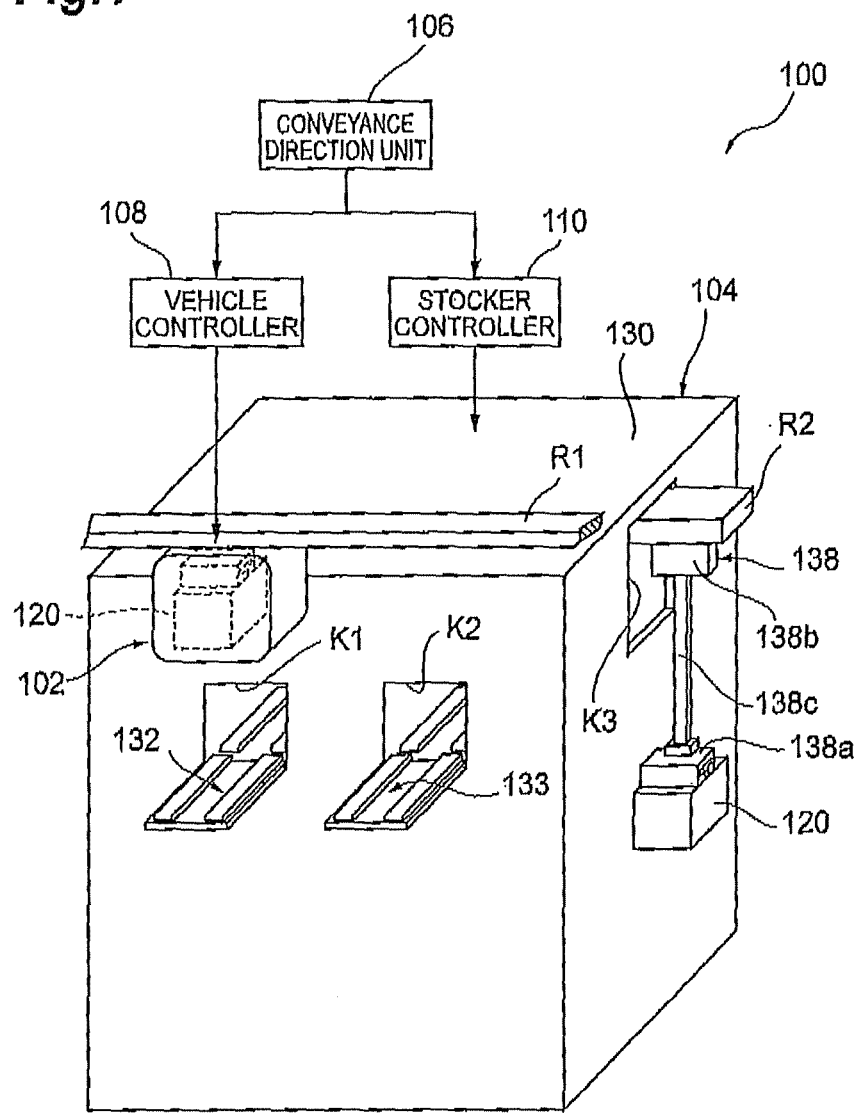
FIG. 1 is a perspective view illustrating an exterior of a carrier system including a storage device according to an embodiment of the present invention.
Figure 2:
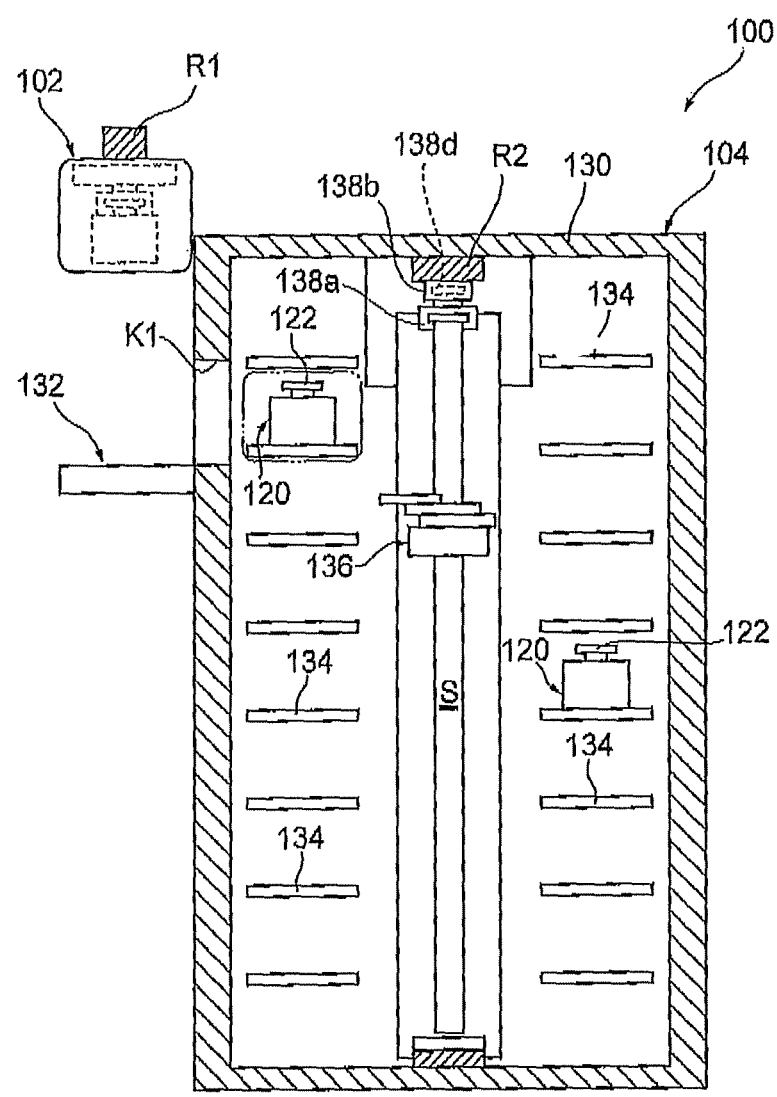
FIG. 2 is a sectional view schematically illustrating an inner structure of the storage device illustrated in FIG. 1.

FIG. 1 is a perspective view illustrating an exterior of a carrier system including a storage device according to an embodiment of the present invention. FIG. 2 is a sectional view schematically illustrating an inner structure of the storage device illustrated in FIG. 1. As illustrated in FIG. 1 and FIG. 2, a carrier system 100 includes a vehicle 102, a stocker 104, and a rail R1 on which the vehicle 102 travels. In addition to the above components, a conveyance direction unit 106, a vehicle controller 108, and a stocker controller 110 are included as a control system. The carrier system 100 carries a FOUP 120 to various kinds of manufacturing apparatuses, the stocker 104, and other devices in accordance with a carrier schedule on a semiconductor device manufacturing, and loads or stores the FOUP 102 in the stocker 104.

The FOUP 120 is an article that is loaded/stored in the stocker 104 and is a cassette loading therein a plurality of semiconductor wafers. The FOUP 120 is carried along the rail R1 by the vehicle 102 and is also carried in the stocker 104 for loading and unloading and adjustment of the storage position. The upper face of the FOUP 120 is provided with a flange 122 that is held by the vehicle 102 and a manual carrier unit 138 described later. The FOUP 120 loads therein, for example, a semiconductor wafer with a diameter of 300 or 450 millimeter.

The vehicle 102 is an overhead hoist transport (OHT) including a linear motor as a power source and travels along the rail R1. The vehicle 102 is configured to carry the FOUP 120, stop at a predetermined position on the rail R1, and transfer the FOUP 120 to/from ports 132, 133 provided to each of the various kinds of manufacturing apparatuses, the stocker 104, and other devices. The vehicle 102 includes a hoist, belt, and gripper. The respective components are controlled by the vehicle controller 108.

The stocker 104 is a storage device capable of loading a plurality of FOUPs 120 carried by the vehicle 102. The stocker 104 includes a body (case) 130, a plurality of (here, a pair of) ports 132, 133, a plurality of shelves 134, an automatic carrier unit (transfer unit) 136, a manual carrier unit (carrier unit) 138, and a drawer device 1 (see FIG. 4).

The body 130 is provided with a plurality of (here, a triplet of) openings K1, K2, and K3. The openings K1, K2 are provided to a lateral face of the body 130 on which the ports 132, 133 are arranged. The opening K3 is provided to another lateral face continuing from the lateral face of the body 130. A rail R2 described later is arranged at the opening K3.

The ports 132, 133 are arranged inside and outside the body 130 through the openings K1, K2. The ports 132, 133 each include a sliding mechanism configured to move the FOUP 120 and are configured to transfer the FOUP 120 between the vehicle 102 and the stocker 104.

As illustrated in FIG. 2, the plurality of shelves 134 (here, eight stages) are arranged in the body 130 in the vertical direction. The shelves 134 are arranged to face each other and form a space S therebetween. FIG. 3 is a diagram illustrating a mounting member and a fixing member of such a shelf. As illustrated in FIG. 3, the shelf 134 includes a mounting member 134a on which the FOUP 120 is mounted and a fixing member 134b that supports and fixes the mounting member 134a.

The mounting member 134a is a plate having a substantially U shape in top view. An opening 135 opening forward is provided to the mounting member 134a. Thus, the mounting member 134a abuts on both ends and rear end of the FOUP 120. The mounting member 134a is provided with a plurality of (here, three) alignment pins 134c. The alignment pins 134c protrude from the top face (mounting surface) of the mounting member 134a and each have a column shape. The alignment pins 134c are portions inserted in alignment holes 124 provided on the bottom of the FOUP 120 when the FOUP 120 is mounted on the mounting member 134a. The alignment pins 134c regulate the displacement of the FOUP 120 in front to back and side to side.

The fixing member 134b has a substantially U shape in top view and arranged under the mounting member 134a. For example, bolts are used to fix the fixing member 134b to a flame (not illustrated) built in the body 130. The fixing member 134b is provided with a plurality of (here, two) openings H1 and H2. The openings H1 and H2 are through holes and arranged side-by-side in the width direction of the fixing member 134b. More specifically, the openings H1 and H2 are positioned within the opening 135 of the substantially U-shaped mounting member 134a. The width of the opening H1 is larger than that of the opening H2.

Note that the interval between the shelves 134 in the vertical direction can be enough unless the FOUP 120 interferes with the shelf 134 lying thereabove when the alignment pins 134c are pulled out from the alignment holes 124 of the FOUP 120 (that is, the FOUP 120 is lifted up over the top ends of the alignment pins 134c). In other words, the interval between the shelves 134 is acceptable when it is the extent of the sum of the height of the FOUP 120 and the heights of the aligning pins 134c. With this configuration, the storage efficiency for the FOUP 120 in the stocker 104 can be improved.

Returning to FIG. 1 and FIG. 2, the automatic carrier unit 136 is a stacker (stacker crane) capable of carrying the FOUP 120 automatically between the shelves 134, and between the ports 132, 133 and the shelves 134 under the control of the stocker controller 110. The automatic carrier unit 136 is arranged movably in the space S in the body 130.

The manual carrier unit 138 is a device capable of carrying (moving) the FOUP 120 in response to operation on a chain block (not illustrated) by an operator. The manual carrier unit 138 includes a gripper (holding member) 138a configured to hold the flange 122 of the FOUP 120, a sliding unit (moving unit) 138b configured to travel both ways along the rail R2 installed on the ceiling of the body 130, and a hoisting mechanism 138d arranged in the sliding unit 138b to feed and wind a belt 138c joined to the gripper 138a.

The conveyance direction unit 106 is a material control system (MCS). The conveyance direction unit 106 produces a conveyance schedule on the basis of the semiconductor device manufacturing schedule from a manufacturing controlling unit (not illustrated) serving as a main controller. The conveyance direction unit 106 is configured to control the vehicle controller 108 and the stocker controller 110 in accordance with the conveyance schedule. The conveyance direction unit 106 directs the vehicle controller 108 to carry the FOUP 120 with the vehicle 102 and directs the stocker controller 110 to carry the FOUP 120 in the stocker 104.

The vehicle controller 108 is configured to not only control the vehicle 102 to carry the FOUP 120 along the rail R1 but also transfer the FOUP 120 between the various kinds of manufacturing apparatuses and the stocker 104 or other devices in accordance with the direction from the conveyance direction unit 106.

The stocker controller 110 is configured to not only control the respective ports 132, 133, and the automatic carrier unit 136 to transfer the FOUP 120 to/from the vehicle 102 through the ports 132, 133 (loading or unloading) but also control the automatic carrier unit 136 to carry the FOUP 120 in the stocker 104 (in-storage device conveyance).

Drawer Device in First Embodiment

Figure 4:
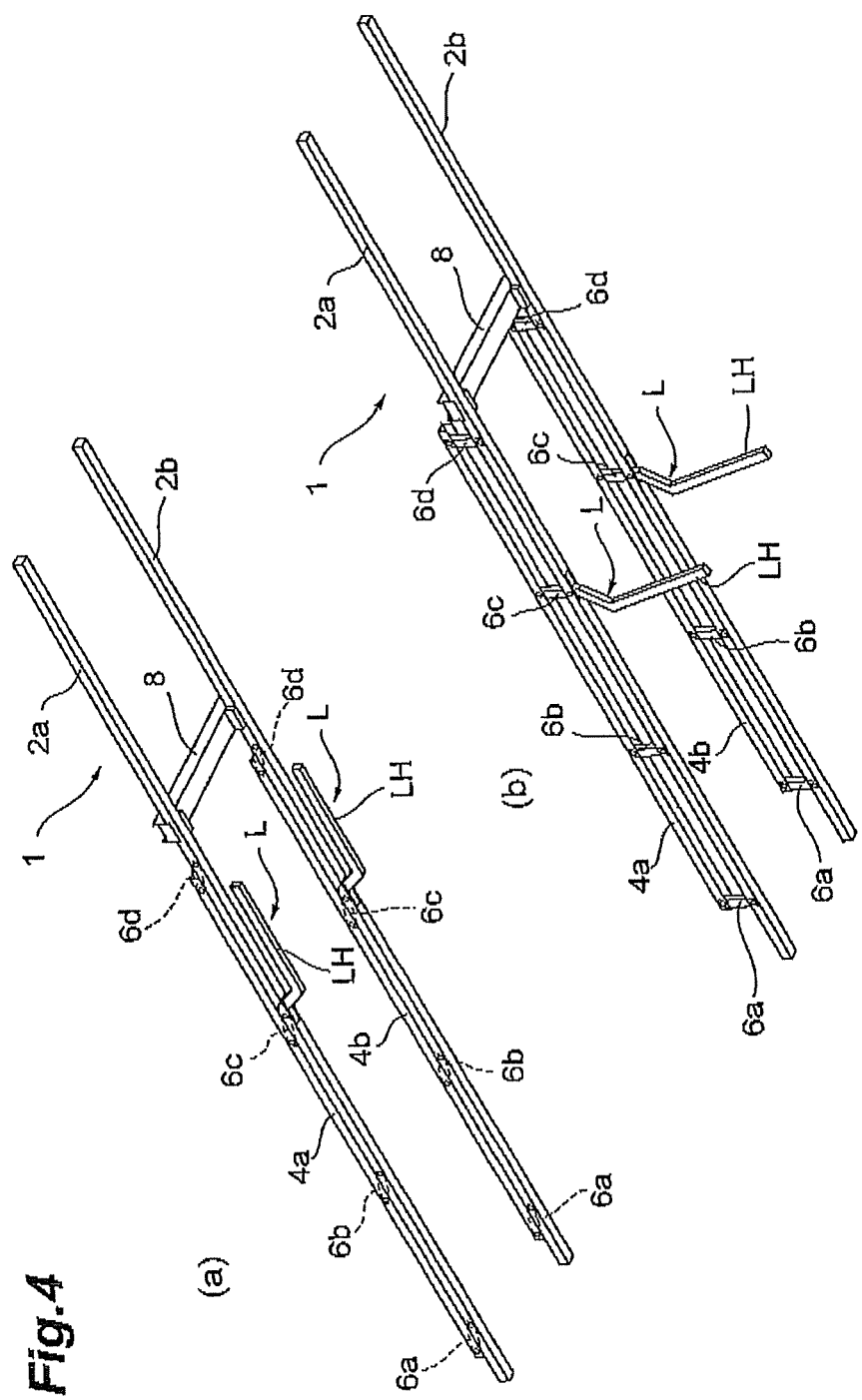
FIG. 4 is a perspective view of a drawer device according to a first embodiment of the present invention seeing from the lower side.

The following describes a drawer device used in the stocker 104 configured as above. FIG. 4 is a perspective view of a drawer device according to a first embodiment of the present invention seeing from the lower side. FIG. 4A illustrates the drawer device in the initial state and FIG. 4B illustrates the drawer device in the state in operation. The drawer device 1 is a device used to draw the FOUP 120 manually from the shelf 134 in the stocker 104. The drawer device 1 is configured to draw out the FOUP 120 to the space S in front of the shelf 134 if the automatic carrier unit 136 is unavailable (see FIG. 8).

As illustrated in FIG. 4, the drawer device 1 includes supporting members 2a, 2b, lifting members 4a, 4b, and linkage members 6a, 6b, 6c, and 6d each connecting the supporting members 2a, 2b and the lifting members 4a, 4b.

The supporting members 2a, 2b each are configured to be fixed to the fixing member 134b of the shelf 134 and are bridged between the fixing members 134b of the couple of shelves 134 opposing each other. The supporting member 2a is an elongated square bar. Both ends of the supporting members 2a, 2b in the extending direction are provided with locking members 3 as illustrated in FIG. 5.

Figure 5:
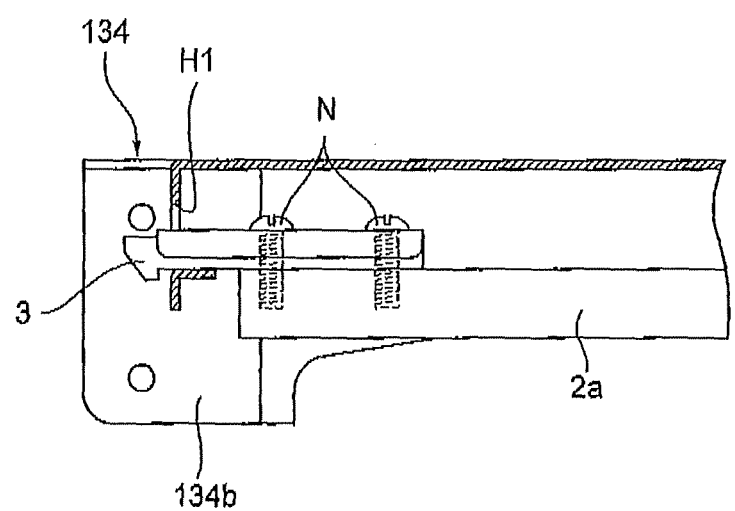
FIG. 5 is a partial enlarged view illustrating a state in which the supporting member is fixed to the fixing member.

As illustrated in FIG. 5, each of the locking members 3 is fixed to the end of the supporting member 2a with, for example, screws N. The locking members 3 are caught on the peripheral edges of the openings H1, H2 when the supporting members 2a, 2b are inserted in the openings H1, H2 of the fixing member 134b. With this configuration, the supporting members 2a, 2b are prevented from falling off the openings H1, H2 of the fixing member 134b when the supporting members 2a, 2b are fixed to the fixing member 134b. Note that the lengths of the supporting members 2a, 2b are configured depending on the stocker 104 as appropriate. The supporting member 2a and the supporting member 2b have the same structure.

Figure 6:
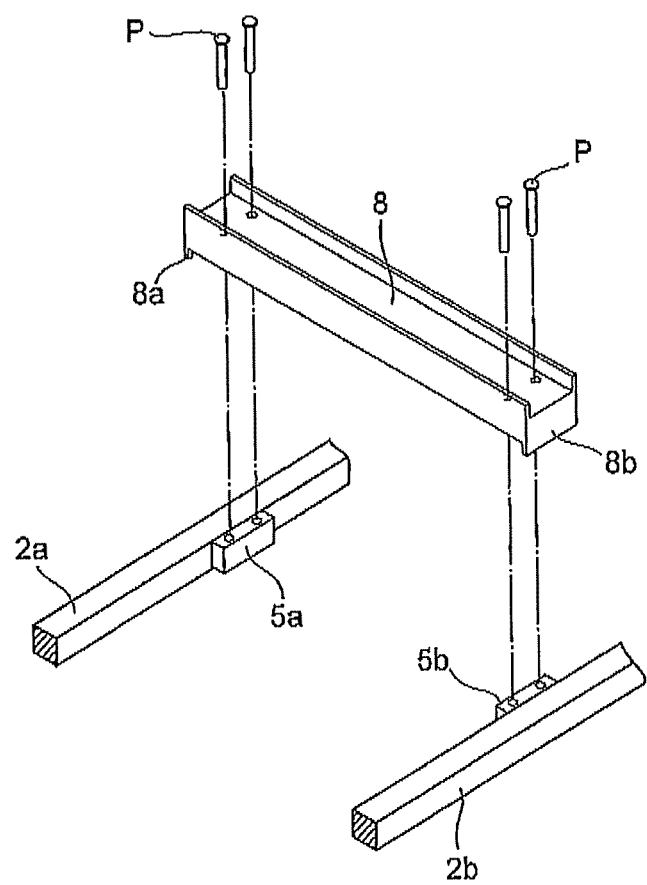
FIG. 6 is a perspective view illustrating the structure of a cross member.

The supporting member 2a and the supporting members 2b are connected through a cross member 8. FIG. 6 is a perspective view illustrating the structure of the cross member. As illustrated in FIG. 6, the cross member 8 is a member having a concave shape in sectional view and is bridged between a pair of supporting members 2a, 2b opposing each other. The cross member 8 is arranged at the supporting members 2a, 2b in a detachable manner. A plurality of (here, two) pins P are inserted in respective joint portions 5a, 5b of the supporting members 2a, 2b to connect the cross member 8 with the supporting members 2a, 2b. Both ends of the cross member 8 in the extending direction are provided with respective overhangs 8a, 8b. The overhangs 8a, 8b are overhung downward and formed along the width direction of the cross member 8 so as to fit the side faces of the supporting members 2a, 2b. The cross member 8 is integrated with the supporting members 2a, 2b, thus regulating the displacement of the supporting members 2a, 2b upon each other.

Figure 8:
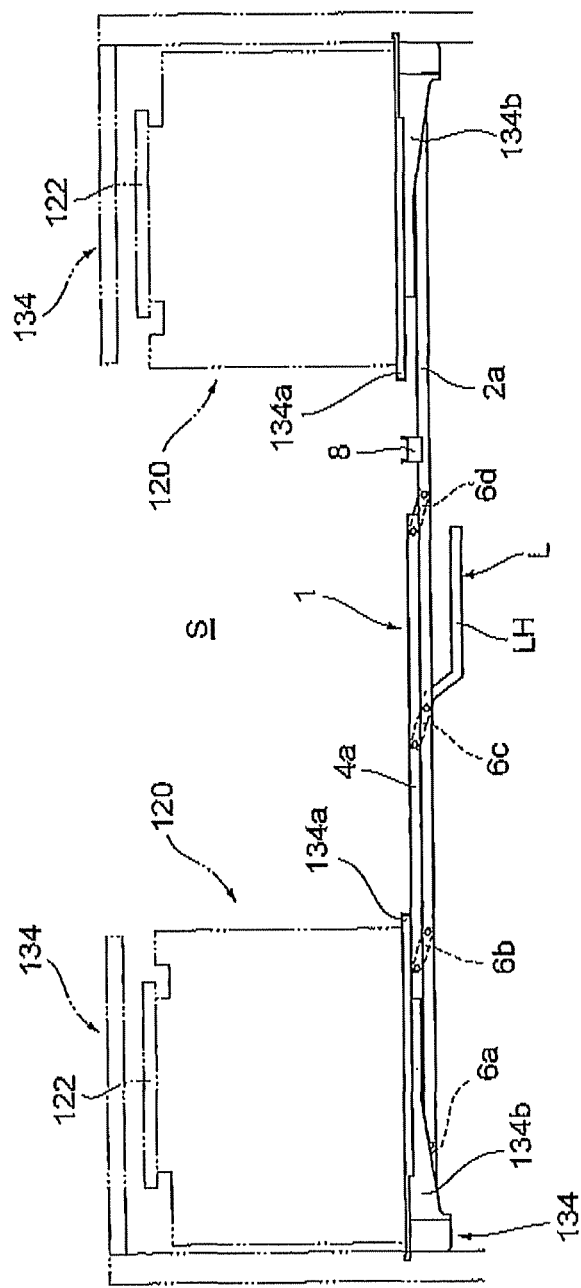
FIG. 8 is a side view of the shelf to which the drawer device is installed.

Returning to FIG. 4, the lifting members 4a, 4b are the parts that abut on and lift up the FOUP 120. The lifting members 4a, 4b are members shorter than the supporting members 2a, 2b. As illustrated in FIG. 8, the lifting members 4a, 4b are shorter than the supporting members 2a, 2b by the depth of the shelf 134 or more.

The lifting members 4a, 4b are mounted on one side face of each of the supporting members 2a, 2b to be closer to one end of each of the supporting members 2a, 2b, respectively, in the extending direction. The lifting members 4a, 4b are arranged on the supporting members 2a, 2b so as to be switchable between the first height position and the second height position with the linkage members 6a to 6d. More specifically, the lifting members 4a, 4b are configured to move between the first height position, at which they abut on (adjoin) the supporting members 2a, 2b as illustrated in FIG. 10A, and the second height position, at which they separate from the supporting members 2a, 2b as illustrated in FIG. 10B. The first height position enables insertion of the lifting members 4a, 4b with the supporting members 2a, 2b into the gap between the fixing part 134b and the FOUP 120 located thereunder. At the second height position, the lifting members 4a, 4b abut on the bottom of the FOUP 120 and lift up the FOUP 120 to a height where the alignment pins 134c on the mounting member 134a come out from the alignment holes 124 of the FOUP 120, that is, the FOUP 120 is lifted up over the top ends of the alignment pins 134c.

The linkage members 6a to 6d are included in the linkage mechanism. The linkage members 6a to 6d are attached to each of the supporting members 2a, 2b and the lifting members 4a, 4b nearly at the same distance and are swingably attached to each of the supporting members 2a, 2b and the lifting members 4a, 4b. The linkage members 6a to 6d allow the supporting members 2a, 2b and the lifting members 4a, 4b to come close to or separate from each other. One end of each of the linkage members 6a, 6a is pivotally supported on the supporting members 2a, 2b, respectively, and the other end of each of the linkage members 6a, 6a is pivotally supported on the lifting members 4a, 4b, respectively. As illustrated in FIG. 10B, portions where the linkage members 6a are connected to the supporting members 2a, 2b and portions where the linkage members 6a are connected to the lifting members 4a, 4b are aligned with each other when the supporting members 2a, 2b are at the remotest position from the lifting members 4a, 4b (at the second height position). Alternatively, as illustrated in FIG. 10A, when the supporting members 2a, 2b abut on the lifting members 4a, 4b (at the first height position), the respective connecting portions of the linkage members 6a are not aligned in the direction in which the supporting members 2a, 2b and the lifting members 4a, 4b are opposite to each other and the connecting portions are displaced in a certain interval each other.

In other words, the linkage members 6a incline with respect to the supporting members 2a, 2b (and the lifting members 4a, 4b) when the lifting members 4a, 4b are at the first height position, whereas the linkage members 6a stand almost vertically with respect to the supporting members 2a, 2b (and the lifting members 4a, 4b) when the lifting members 4a, 4b are at the second height position. The linkage members 6b to 6d have the same configuration as the linkage members 6a.

The linkage members 6c are formed integrally with levers L. That is, one end of each of the levers L constitutes the corresponding linkage member 6c. The levers L include handles LH gripped by an operator. In an initial state in which the supporting members 2a, 2b abut on the lifting members 4a, 4b, the handles LH are almost parallel to the supporting members 2a, 2b (and the lifting members 4a, 4b). The lifting members 4a, 4b move up and down in response to the operation on the levers L. More specifically, the linkage members 6c stand up as the levers L are pushed down, thus, the lifting members 4a, 4b separate from the supporting members 2a, 2b and are lifted up. In contrast to the above, the linkage members 6c incline as the levers L are pushed up, thus, the lifting members 4a, 4b come close to the supporting members 2a, 2b and are pulled down. Note that the levers L include lock mechanisms (not illustrated). The lock mechanisms are configured to keep the second height position of the lifting members 4a, 4b.

The following describes a method of installing the drawer device 1. First, the supporting member 2a is prepared so as to locate the lifting member 4a under the FOUP 120 to be drawn. Thereafter, an end of the supporting member 2a (locking member 3) is inserted into the opening H1 in one fixing member 134b and another end of the supporting member 2a is inserted into the opening H2 in another fixing member 134b opposite to the aforementioned one, and thus the supporting member 2a is bridged and fixed between the fixing members 134b that oppose each other.

Figure 7:
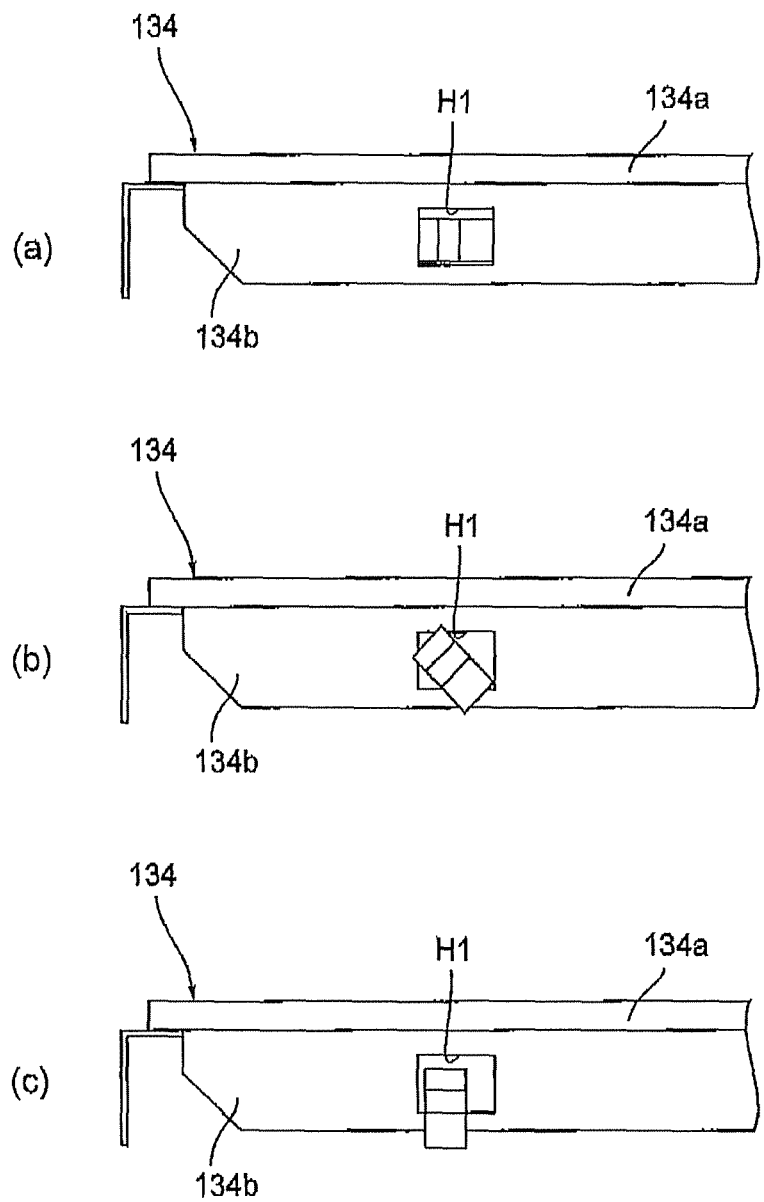
FIG. 7 is a diagram illustrating installation of the supporting member.
Figure 9:
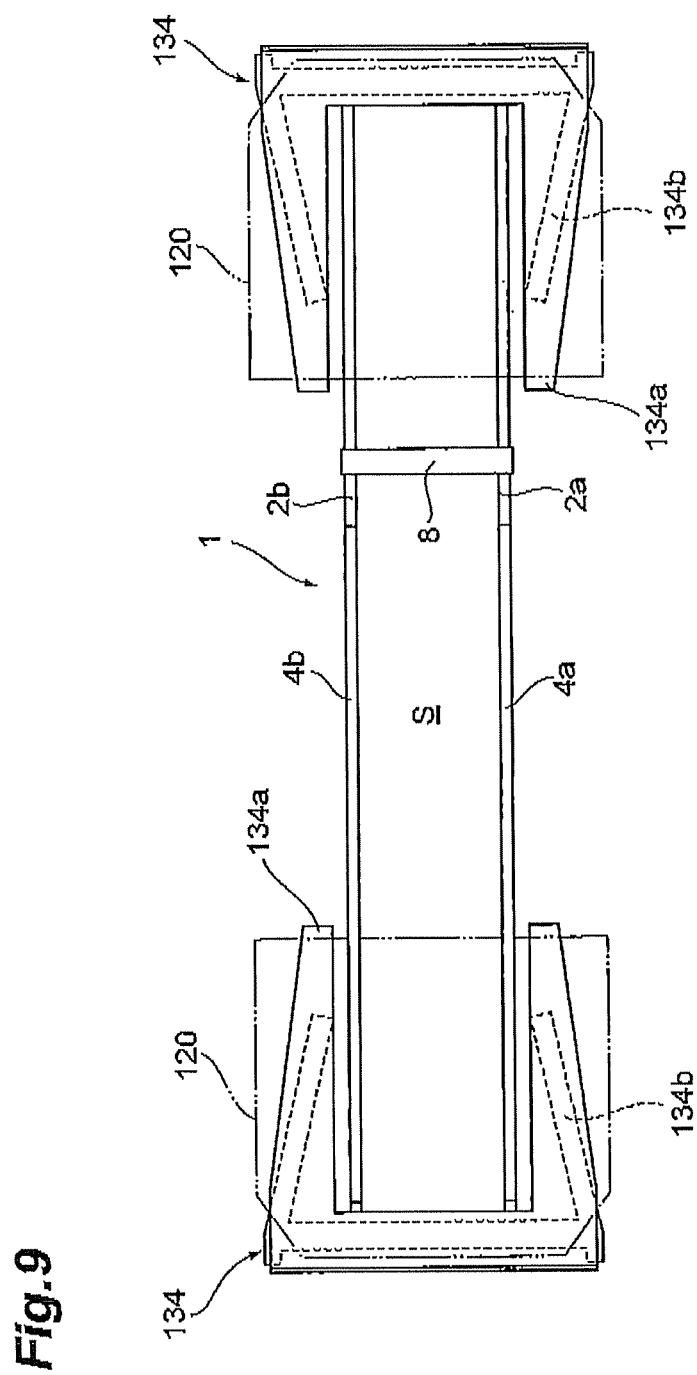
FIG. 9 is a top view of the shelf to which the drawer device is installed.

In this operation, as illustrated in FIG. 7, the supporting member 2a is laid (a state where the direction in which the supporting member 2a and the lifting member 4a are opposite to each other is nearly the same as the horizontal direction) and inserted into the openings H1 and H2 of the fixing members 134b. Thereafter, the supporting member 2a is rolled almost 90 degrees to be a vertical position (a state where the direction in which the supporting member 2a and the lifting member 4a are opposite to each other is nearly the same as the vertical direction). The supporting member 2b is bridged and fixed between the fixing members 134b opposing to each other in the same way. Thereafter, the cross member 8 is bridged and fixed between the supporting member 2a and the supporting member 2b to install the drawer device 1 as illustrated in FIG. 8 and FIG. 9.

Figure 10:
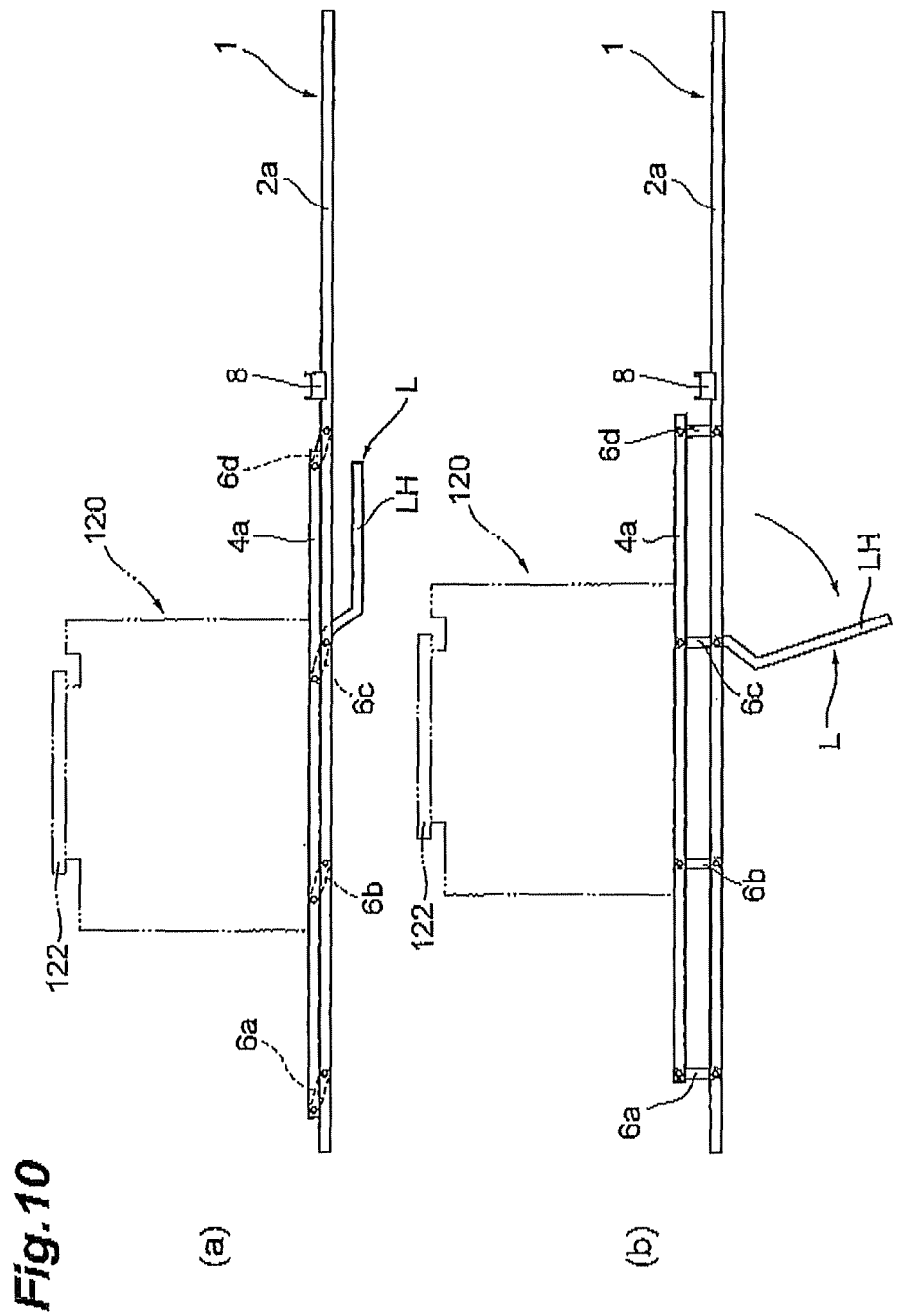
FIG. 10 is a diagram illustrating operation of the drawer device.

The following describes a method of unloading the FOUP 120 using the drawer device 1. FIG. 10 is a diagram illustrating operation of the drawer device. As illustrated in FIG. 10A, the drawer device 1 is installed so as to locate the lifting members 4a, 4b under the FOUP 120 to be drawn. The lifting members 4a, 4b take the first height position in this state. Next, the levers L are pushed down as illustrated in FIG. 10B.

With this configuration, the lifting members 4a, 4b separate from the supporting members 2a, 2b by the linkage members 6a to 6d and are lifted up to the second height position, thereby abutting on and lifting up the FOUP 120. The top faces of the lifting members 4a, 4b are lifted up to a position higher than the top ends of the alignment pins 134c arranged on the mounting member 134a. Subsequently, lifting up the FOUP 120, the lifting members 4a, 4b slide the FOUP 120 thereon to draw out the FOUP 120 toward the front of the shelf 134.

After the FOUP 120 is drawn out, the manual carrier unit 138 is prepared to hold the flange 122 of the FOUP 120 with the gripper 138a. Thereafter, the FOUP 120 is hoisted up with the hoisting mechanism 138d and is taken out through the opening K3. As described above, the FOUP 120 is taken out with the drawer device 1 and the manual carrier unit 138.

As explained above, the drawer device 1 includes the supporting members 2a, 2b configured to be inserted in the gap under the FOUP 120 and to be fixed to the shelf 134, and the lifting members 4a, 4b configured to switch between the first height position and the second height position. Taking the first height position, the lifting members 4a, 4b can be inserted in a narrow gap with the supporting members 2a, 2b, and thus the supporting members 2a, 2b can be easily fixed to the shelf. Furthermore, when the supporting members 2a, 2b are fixed and the lifting members 4a, 4b switch to the second height position, the FOUP 120 can be lifted up and can be slid and drawn to the front of the shelf 134. As described above, the drawer device 1 can be installed easily in a narrow gap between the shelf 134 and the FOUP 120. This makes the work for fitting the holding member performed in the narrow gap unnecessary, for example. Thus the workability can be improved.

As described above, the drawer device 1 is configured to be inserted into the narrow gap between the shelf 134 and the FOUP 120. Thus, an interval between the shelves 134 can be set to a certain degree in which the FOUP 120 lifted up does not come into contact with the upper shelf 134. Thus, it is not necessary to secure a space conventionally used to insert a gripper and the storage efficiency for the FOUP 120 in the stocker 104 can be improved.

The drawer device 1 is configured to allow the supporting members 2a, 2b and the lifting members 4a, 4b to come close to or separate from each other by the linkage members 6a to 6d. Thus, the lifting members 4a, 4b can switch between the first height position and the second height position by moving the lifting members 4a, 4b toward or away from the supporting members 2a, 2b. Thus, the operation can be easy and the reliability of the motion is secured.

Drawer Device in Second Embodiment

The following describes a drawer device according to a second embodiment. FIG. 11 is a diagram illustrating a drawer device according to a second embodiment of the present invention. FIG. 11A is a top view of the drawer device and FIG. 11B is a sectional view taken along line b-b in FIG. 11A. This drawer device 20 illustrated in FIG. 11 is a device used to draw the FOUP 120 manually from the shelf 134 in the stocker 104.

As illustrated in FIG. 11, the drawer device 20 includes supporting members 21a, 21b and lifting members 24a, 24b. The supporting members 21a, 21b each are configured to be fixed to the fixing member 134b of the shelf 134 and are bridged between the fixing members 134b of the couple of shelves 134 opposing to each other. The supporting members 21a, 21b each may be elongated components and rotatably arranged about the respective axes.

Both ends of the supporting members 21a, 21b in the extending direction are provided with the locking members 3 (see FIG. 5) and locking members 25, the locking members 25 closer to the center of the supporting members 21a, 21b than the locking members 3. The locking members 25 are located in front of the openings H1, H2 when the supporting members 21a, 21b are attached to the fixing members 134b, and cooperate with the locking members 3 to prevent the supporting members 21a, 21b from moving (displacing). Note that a section of each of the supporting members 21a, 21b may be a circle or may be a rectangle with beveled corners. In view of the stability of the supporting members 21a, 21b attached to the fixing members 134b, the sections are preferable to be rectangles with beveled corners.

The lifting members 24a, 24b are the parts that abut on and lift up the FOUP 120. The lifting members 24a, 24b are members shorter than the supporting members 21a, 21b. More specifically, the lifting members 24a, 24b are shorter than the supporting members 21a, 21b by the depth of the shelf 134 or more.

The lifting members 24a, 24b are integrally formed with the supporting members 21a, 21b. The lifting members 24a, 24b may have approximately elliptic sections and may be provided to the supporting members 21a, 21b closer to one side thereof in the extending direction, respectively. The lifting members 24a, 24b are configured to switch between the first height position and the second height position by changing the major axis direction of the section of each of the lifting members 24a, 24b. More specifically, as illustrated in FIG. 11B, the lifting members 24a, 24b are configured to switch between the first height position where the major axis direction is almost horizontal and the second height position where the major axis direction is almost vertical. The first height position enables insertion of the lifting members 24a, 24b with the supporting members 21a, 21b into the gap between the fixing part 134b and the FOUP 120 located thereunder. At the second height position, the lifting members 4a, 4b abut on the bottom of the FOUP 120 and lift up the FOUP 120 to a height where the alignment pins 134c on the mounting member 134a come out from the alignment holes 124 of the FOUP 120, that is, the FOUP 120 is lifted up over the top ends of the alignment pins 134c (see FIG. 13).

The supporting members 21a, 21b including the lifting members 24a, 24b each are provided with levers L1. The levers L1 are attached to the lifting members 24a, 24b to be substantially parallel to the major axis direction. With this configuration, the lifting members 24a, 24b take the first height position when the levers L1 are almost horizontal, by contrast, the lifting members 24a, 24b take the second height position when the levers L1 are almost vertical. The levers L1 are detachably provided to the supporting members 21a, 21b. More specifically, for example, the levers L1 have tip ends on which screw threads are formed. The levers L1 can be attached to the supporting members 21, 21b by screwing the levers L1 to the supporting members 21a, 21b. With this configuration, the storage space for the drawer device 20 not in use can be reduced.

Figure 12:
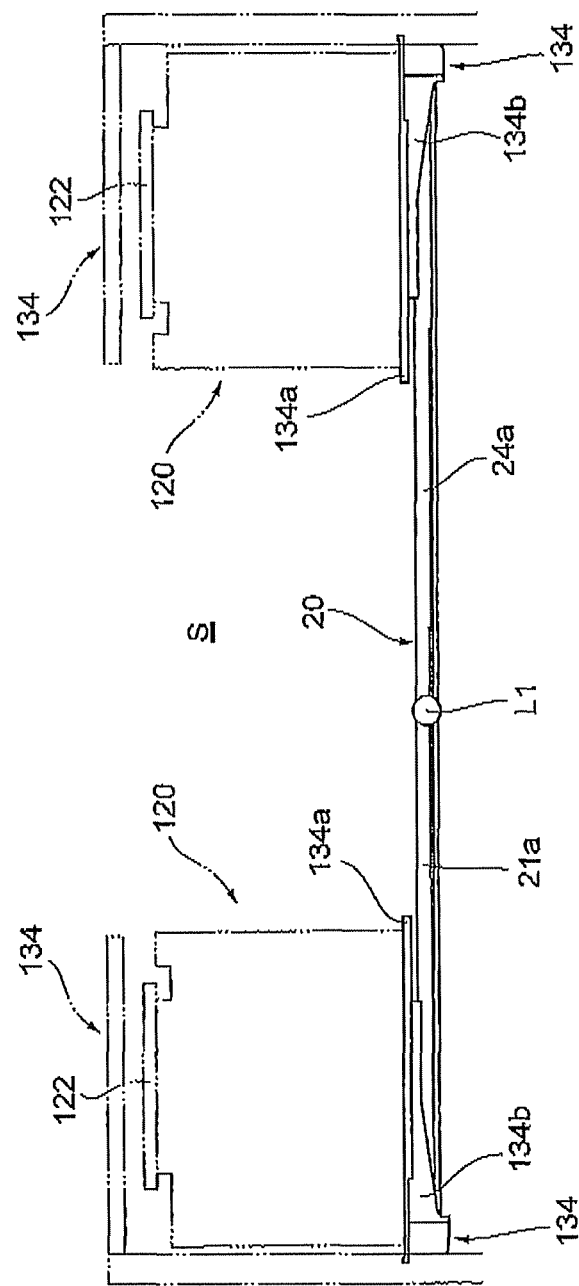
FIG. 12 is a side view of the shelf to which the drawer device is installed.

The following describes a method of installing the drawer device 20. First, the supporting member 21a is prepared so as to locate the lifting member 24a under the FOUP 120 to be drawn. Thereafter, an end of the supporting member 21a is inserted into the opening H1 in one fixing member 134b and another end of the supporting member 21a is inserted into the opening H2 in another fixing member 134b opposite to the aforementioned one, and thus the supporting member 21a is bridged and fixed between the fixing members 134b. The supporting member 2b is bridged and fixed between the fixing members 134b in the same way. As illustrated in FIG. 12, the drawer device 20 is installed.

Figure 13:
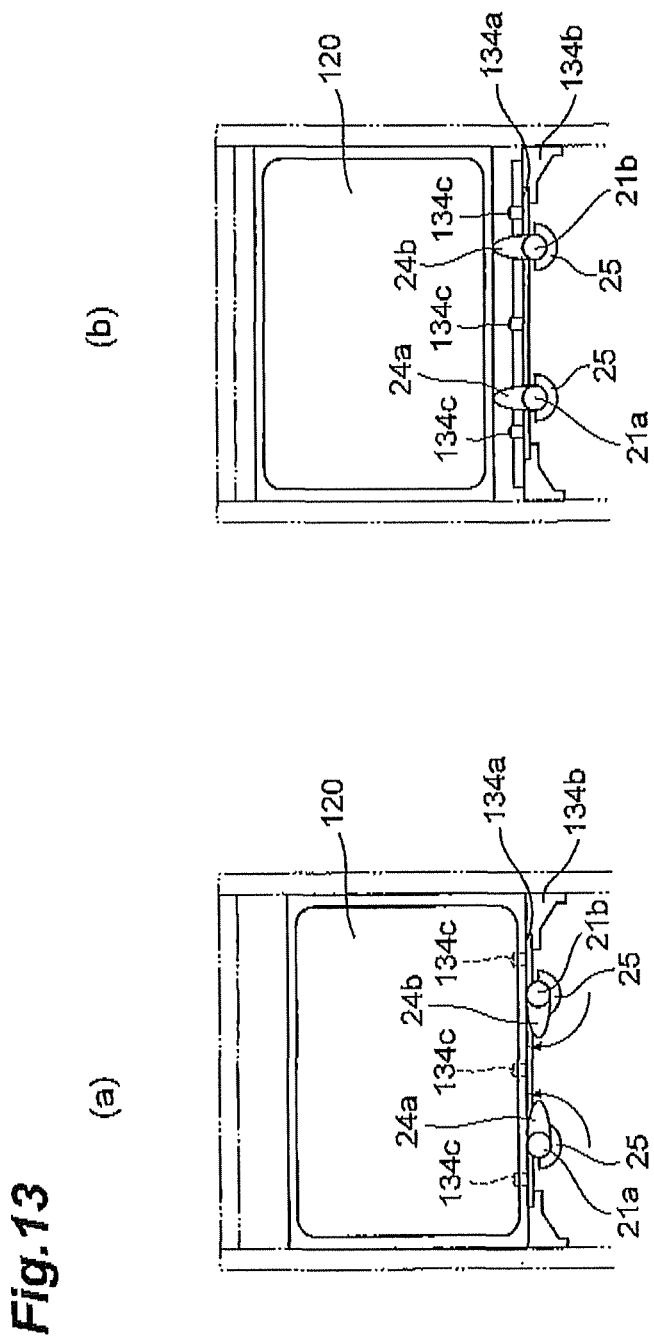
FIG. 13 is a diagram illustrating operation of the drawer device.

The following describes a method of unloading the FOUP 120 using the drawer device 20. FIG. 13 is a diagram illustrating operation of the drawer device. As illustrated in FIG. 13, the drawer device 20 is installed so as to locate the lifting members 24; 24b under the FOUP 120 to be drawn. The lifting members 24a, 24b take the first height position in this state. Subsequently, the levers L1 are pushed down so as to rotate the supporting members 21a, 21b in the directions indicated by the arrows illustrated in FIG. 13A.

With this configuration, as illustrated in FIG. 13B, the lifting members 24a, 24b rotate and the major axes thereof are almost vertical. Thus, the lifting members 24a, 24b take the second height position and abut on the FOUP 120, thereby lifting up the FOUP 120. The FOUP 120 is lifted up to a position where the bottom thereof is higher than the top ends of the alignment pins 134c arranged on the mounting member 134a in this operation. Subsequently, lifting up the FOUP 120, the lifting members 24a, 24b slide the FOUP 120 thereon to draw out the FOUP 120 toward the front of the shelf 134.

After the FOUP 120 is drawn out, the manual carrier unit 138 is prepared to hold the flange 122 of the FOUP 120 with the gripper 138a. Thereafter, the FOUP 120 is hoisted up with the hoisting mechanism 138d and is taken out through the opening K3. As described above, the FOUP 120 is taken out with the drawer device 20 and the manual carrier unit 138.

As explained above, the drawer device 20 includes the supporting members 21a, 21b configured to be inserted in the gap under the FOUP 120, and to be fixed to the shelf 134, and the lifting members 24a, 24b configured to switch between the first height position and the second height position. Taking the first height position, the lifting members 24a, 24b can be inserted in a narrow gap with the supporting members 21a, 21b, and thus the supporting members 21a, 21b can be easily fixed to the shelf. Furthermore, when the supporting members 21a, 21b are fixed and the lifting members 24a, 24b switch to the second height position, the FOUP 120 can be lifted up and can be slid and drawn to the front of the shelf 134. As described above, the drawer device 20 can be installed easily in a narrow gap between the shelf 134 and the FOUP 120. This makes the work for fitting the holding member performed in the narrow gap unnecessary, for example. Thus the workability can be improved.

In the drawer device 20, the supporting members 21a, 21b and the lifting members 24a, 24b are formed integrally. With this configuration, the lifting members 24a, 24b can be easily switched between the first height position and the second height position by rotationally operating the supporting members 21a, 21b. Furthermore, integrating the supporting members 21a, 21b and the lifting members 24a, 24b simplifies the structure and improves durability.

Figure 14:
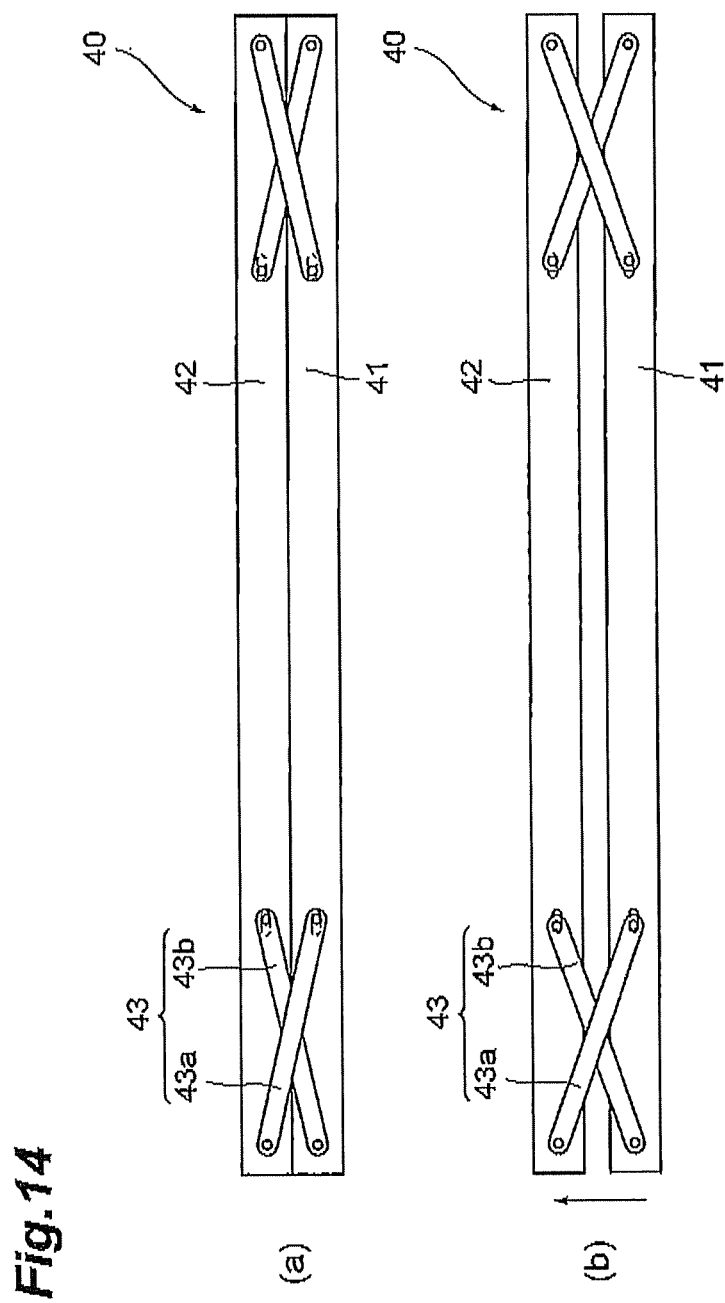
FIG. 14 is a diagram illustrating a drawer device according to a modification.

The present invention is not limited to the above-described embodiments. For example, the following configurations are applicable to the drawer device. FIG. 14 is a diagram illustrating a drawer device according to a modification. As illustrated in FIG. 14, a drawer device 40 includes supporting members 41, lifting members 42, and linkage members 43 each connecting the supporting members 41 and the lifting members 42. The supporting members 41 and the lifting members 42 may be elongated components. The linkage members 43 each include first members 43a and second members 43b.

The first members 43a and the second members 43b are arranged to be crossed each other. One end of each of the first members 43a (depicted leftward) is swingably and pivotally supported with the supporting members 2a, 2b, and one end of each of the second members 43b is swingably and pivotally supported with the corresponding lifting member 42. The other end of each of the first members 43a (for example, depicted rightward) is slidably supported with the corresponding lifting member 42, and the other end of each of the second members 43b is slidably supported with the corresponding supporting member 41. The above-mentioned configuration allows the drawer device 40 to shift between the first height position where the supporting members 41 abut on the lifting members 42 and the second height position where the supporting members 41 separate from the lifting members 42. The motion of the lifting members 42 can be achieved by using an electric motor, an air cylinder, or an electric cylinder, for example.

Figure 15:
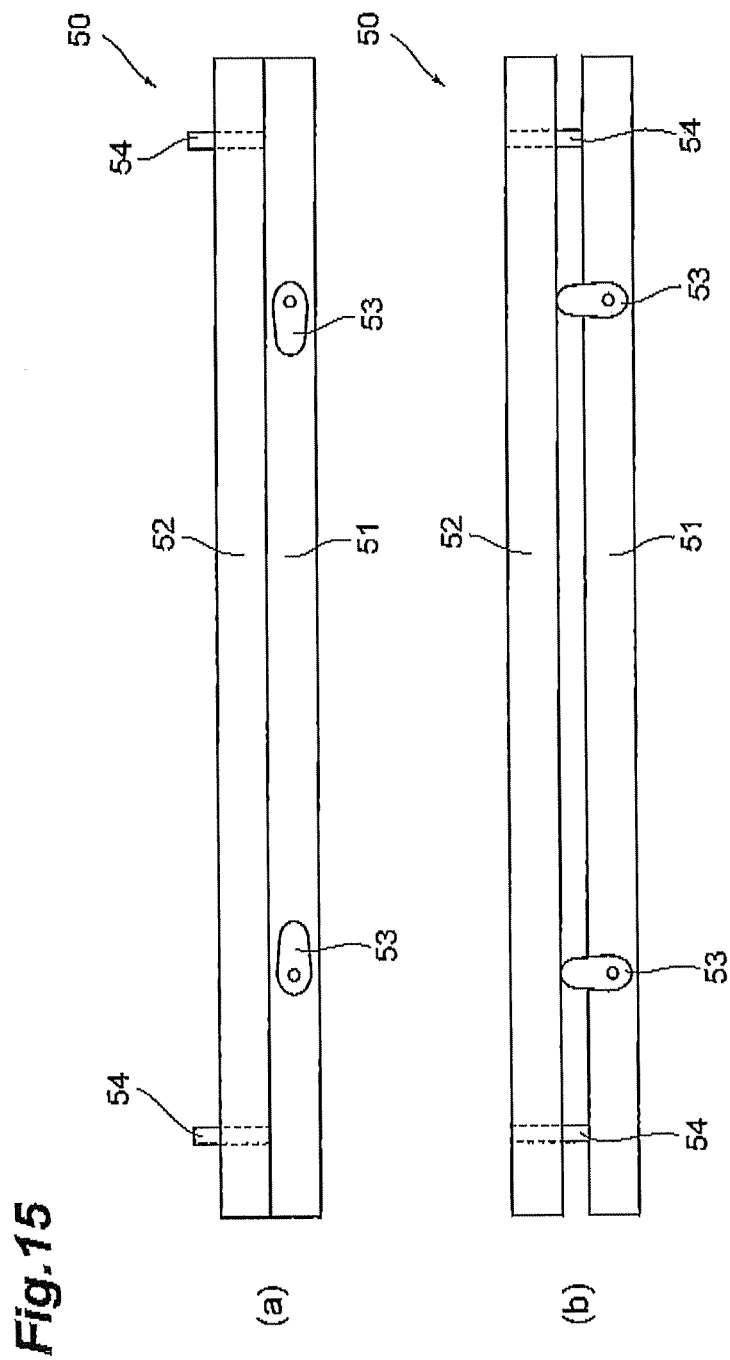
FIG. 15 is a diagram illustrating a drawer device according to a modification.

As illustrated in FIG. 15, a drawer device 50 includes supporting members 51, lifting members 52, cam members 53, and guiding members 54. The cam members 53 are rotatably supported with the supporting members 51. The rotation of the cam members 53 can be achieved by using an electric motor, for example.

The guiding members 54 are provided to both ends of the supporting members 51. The guiding members 54 are almost vertically arranged on the supporting members 51 and regulate the displacement of the lifting members 52. The lifting members 52 move up and down along the guiding members 54. The above-mentioned configuration allows the drawer device 50 to shift between the first height position where the supporting members 51 abut on the lifting members 52 and the second height position where the supporting members 51 separate from the lifting members 52 by the rotation of the cam members 53. Note that the cam members 53 may be provided to the lifting members 52.

Although a couple of pins are used to connect each of the joint portions 5a, 5b of the supporting members 2a, 2b and the cross member 8 in the one embodiment, even one pin can be enough for each joint. In this case, it is preferable that the section of the pin be a polygon. Furthermore, two or more of the cross members 8 may be provided. The point is that the supporting members 2a, 2b can regulate displacement mutually.

Although the supporting members 21a, 21b and the lifting members 24a, 24b of the drawer device 20 are formed integrally in the other embodiment, the lifting members 24a, 24b may be detachably provided to the supporting members 21a, 21b.

REFERENCE SIGNS LIST 1, 20, 40, 50 . . . drawer device, 2a, 2b, 21a, 21b, 41, 51 . . . supporting member, 4a, 4b, 24a, 24b, 42, 52 . . . lifting member, 6a to 6d . . . linkage member (linkage mechanism), 53 . . . cam member, 54 . . . guiding member, 104 . . . stocker (storage device), 120 . . . FOUP (article), 130 . . . body (case), 132, 133 . . . port, 134 . . . shelf, 134a . . . mounting portion, 134b . . . supporting member, 136 . . . automatic carrier unit (transfer unit), 138 . . . manual carrier unit (transfer unit), 138a . . . gripper (holding member), 138b . . . sliding unit (moving unit), 138c . . . belt, 138d . . . hoisting mechanism.

The invention claimed is:

1. A drawer device provided to a storage device including a plurality of shelves for loading and unloading an article through an opening that opens forward to draw the article forward from each of the shelves through the opening, the drawer device comprising:
    a supporting member configured to be inserted in a gap under the article loaded on any of the shelves and to be fixed to the shelf, and
    a lifting member provided to the supporting member, configured to switch between a first height position and a second height position, where the first height position enables insertion of the supporting member into the gap and the second height position allows the lifting member to lift the article higher than the first height position, and configured to slide the article toward the front of the shelf at the second height position,
    wherein at least one of the plurality of shelves comprises two side portion with a space between and wherein the supporting members is simultaneously supported on the two side portion.

2. The drawer device according to claim 1, wherein
the shelf is provided with an alignment pin configured to be inserted in an alignment hole in the bottom of the article when the article is loaded, and
the second height position is a position at which the alignment pin comes out the alignment hole.

3. The drawer device according to claim 1, wherein
the supporting member and the lifting member are elongated components, and
the supporting member and the lifting member are connected through a linkage mechanism to allow the lifting member to switch between the first height position and the second height position.

4. The drawer device according to claim 1, wherein
the supporting member and the lifting member are elongated components,
the lifting member moves along a guide member regulating the motion between the first height position and the second height position, and
a cam member configured to switch the lifting member between the first height position and the second height position is provided to at least one of the supporting member and the lifting member.

5. The drawer device according to claim 1, wherein
the supporting member is an elongated component and configured to rotate about an axis,
the lifting member has an approximately elliptic section and is provided to the supporting member integrally,
the first height position provides a state in which the major axis of the section of the lifting member is almost horizontal, and
the second height position provides a state in which the major axis of the section of the lifting member is almost vertical.

6. A storage device comprising:
a case;
a plurality of shelves provided in the case and each configured to load and unload an article through an opening that opens forward;
a port performing loading and unloading the article;
a transfer unit configured to transfer the article between each of the shelves and the port; and
a drawer device for drawing the article forward from the shelf through the opening, wherein the drawer device includes:
    a supporting member configured to be inserted in a gar under the article loaded on any of the shelves and to be fixed to the shelf, and
    a lifting member provided to the supporting member, configured to switch between a first height position and a second height position, where the first height position enables insertion of the supporting member into the gap and the second height position allows the lifting member to lit the article higher that the first height position, and configured to slide the article toward the front of the shelf at the second height position,
    wherein at least one of the plurality of shelves comprises two side portions with a space between, and wherein the supporting member is simultaneously supported on the two side portions.

7. The storage device according to claim 6, further comprising:
a carrier unit configured to be manually operated and including:
    a holding member configured to hold the article;
    a hoisting mechanism configured to feed and wind a belt joined to the holding member; and
    a traveling mechanism provided with the hoisting mechanism and configured to travel along a rail installed on an upper portion of the case.

* * * * *